United States Patent [19]
Gardner et al.

[11] Patent Number: 6,054,364
[45] Date of Patent: *Apr. 25, 2000

[54] CHEMICAL MECHANICAL POLISHING ETCH STOP FOR TRENCH ISOLATION

[75] Inventors: Mark I. Gardner, Cedar Creek; Mark C. Gilmer, Austin, both of Tex.

[73] Assignee: Advanced Micro Devices, Austin, Tex.

[*] Notice: This patent issued on a continued prosecution application filed under 37 CFR 1.53(d), and is subject to the twenty year patent term provisions of 35 U.S.C. 154(a)(2).

[21] Appl. No.: 09/149,700

[22] Filed: Sep. 8, 1998

[51] Int. Cl.⁷ .................................................. H01L 21/76
[52] U.S. Cl. ........................ 438/425; 438/359; 438/426; 438/427
[58] Field of Search .................................. 438/359, 424, 438/425, 426, 427

[56] References Cited

U.S. PATENT DOCUMENTS

| | | | |
|---|---|---|---|
| 5,332,683 | 7/1994 | Miyashita et al. | 437/33 |
| 5,360,753 | 11/1994 | Park et al. | 437/67 |
| 5,536,675 | 7/1996 | Bohr | 437/67 |
| 5,783,476 | 7/1998 | Arnold | 438/425 |
| 5,817,566 | 10/1998 | Jang et al. | 438/424 |
| 5,817,568 | 10/1998 | Chao | 438/427 |
| 5,866,466 | 2/1999 | Kim et al. | 438/426 |
| 5,872,043 | 2/1999 | Chen | 438/424 |

OTHER PUBLICATIONS

Silicon Processing for the VLSI Era, vol. 2: Process Integration, by Stanley Wolf Ph.D., 1990, pp. 51–52.

*Primary Examiner*—Wael Fahmy
*Assistant Examiner*—Long Pham
*Attorney, Agent, or Firm*—Williams, Morgan & Amerson

[57] ABSTRACT

The present invention is directed to am improved chemical mechanical polish etch stop for a trench isolation and a method for making same. The method comprises forming at least four process layers above a surface of a semiconducting substrate. The method further comprises patterning said plurality of process layers to define an opening exposing a portion of the surface of the substrate. A trench is formed in the substrate, and the trench and the opening are then filled with a dielectric material. The surface of the dielectric material and the surface of the top process layer are then planarized. The present inventive structure is comprised of at least four process layers positioned above a substrate, an opening formed in said plurality of layers, a trench formed in said substrate, and a dielectric material positioned in said opening and said.

21 Claims, 2 Drawing Sheets

CHEMICAL MECHANICAL POLISHING ETCH STOP FOR TRENCH ISOLATION

BACKGROUND OF THE INVENTION

1. Field of the Invention

The present invention is generally directed to the field of semiconductor processing, and, more particularly, to a method of forming a trench isolation on semiconductor devices.

2. Description of the Related Art

In modern semiconductor fabrication, many thousands of integrated circuits are formed above the surface of a semiconducting substrate. In order that these various circuits properly operate, they must be electrically isolated from one another. Isolations are regions formed on an integrated circuit device to electrically isolate the various components and/or circuits of an integrated circuit device. One type of isolation commonly employed in the manufacture of integrated circuit devices is a trench isolation.

Typically, after such trench isolations are formed, the top surface of the isolation is subjected to one or more chemical mechanical polishing operations during the course of manufacturing the integrated circuit device. Additionally, such trench isolations, when comprised of a dielectric material, such as TEOS, have been subject to excessive dishing. Moreover, during subsequent processing of the semiconductor device, the height of such an isolation may be further reduced by the various cleanings of the semiconductor device to remove, for example, regions of native oxide that may have formed. This excessive dishing and reduction in the overall height of the isolation can cause many problems in the ultimate finished integrated circuit device. For example, if dishing becomes excessive, or if the isolation becomes too short, then there is a danger of exposure or insufficient coverage of the junction between the surface of the silicon substrate and the edge of the trench formed in the substrate. Such inadequate, or incomplete, insulation of that region may cause many problems. For example, various conductors are run across these isolations to electrically connect various integrated circuit devices. If there is insufficient insulation between these current conductors and the substrate, then current leakage may occur into the substrate.

The present invention is directed to a semiconductor device that minimizes or reduces some or all of the aforementioned problems and a method of making same.

SUMMARY OF THE INVENTION

The present invention is directed to a method of forming an improved chemical mechanical polishing etch stop for trench isolations, and to such an improved structure. The method comprises forming first, second, third, and fourth process layers above a surface of said semiconducting substrate, and patterning the plurality of process layers to define an opening and expose a portion of the surface of the substrate. The method further comprises etching a trench in the substrate and forming at least one dielectric material in the opening defined by the process layers and in the trench in the substrate. The method further comprises planarizing the upper surface of the gate dielectric with the upper surface of the uppermost layer of said plurality of process layers.

The structure is comprised of a wafer comprised of a semiconducting substrate, at least four process layers formed above the surface of the substrate, an opening formed in the four process layers, and a trench formed in the substrate. A dielectric material is positioned in the trench and the opening in said process layers, the upper surface of the dielectric material is approximately planar with the upper surface of the uppermost layer of the at least four process layers.

BRIEF DESCRIPTION OF THE DRAWINGS

The invention may be understood by reference to the following description taken in conjunction with the accompanying drawings, in which like reference numerals identify like elements, and in which.

Figure 1:
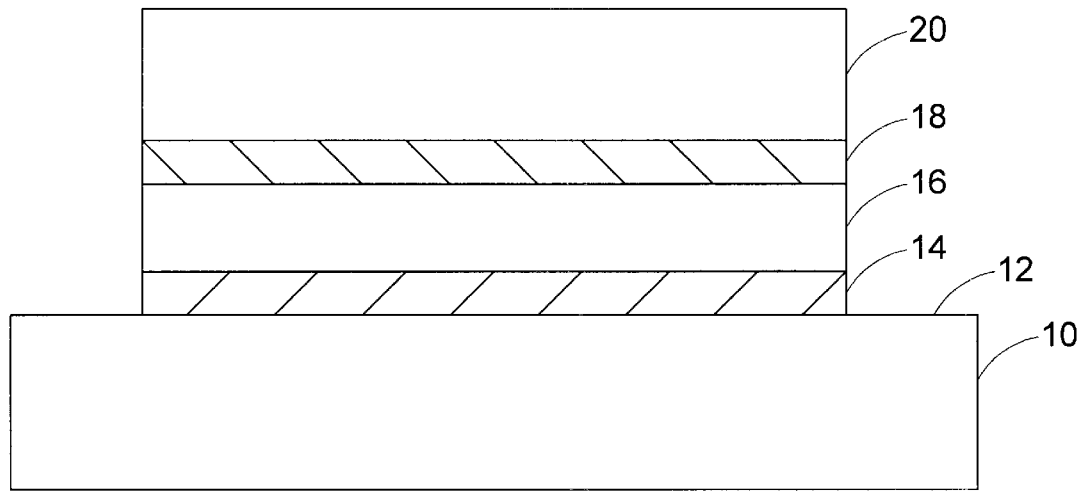
FIG. 1 is a cross-sectional view of an illustrative semiconductor substrate having a plurality of process layers formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–3. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

As shown in FIG. 1, a plurality of process layers 14, 16, 18 and 20 are formed above the surface 12 of a semiconducting substrate 10. These various process layers 14, 16, 18 and 20 may be formed by any of a variety of known techniques, such as chemical vapor deposition (CVD), sputter deposition, low pressure chemical vapor deposition (LPCVD), thermally grown, etc. The semiconducting substrate 10 may be comprised of any semiconductor material and, in one illustrate embodiment, is comprised of silicon.

As shown in FIG. 1, the first process layer 14 is formed above the surface 12 of the substrate 10. The first process layer 14 may be comprised of a variety of materials, such as silicon dioxide or a nitrogen bearing oxide, and may be formed by a variety of techniques known to those skilled in the art. The first process layer 14 is comprised of a thermally grown layer of silicon dioxide having a thickness ranging from approximately 100–200 Å, and in one embodiment is approximately 150 Å.

As shown in FIG. 1, the second process layer 16 is formed above the first process layer 14. The second process layer 16 may be comprised of a variety of materials, such as silicon nitride or other like material, and may be formed by a variety of techniques known to those skilled in the art. The second process layer 16 is comprised of a deposited layer of silicon nitride having a thickness ranging from approximately 400–600 Å, and in one embodiment is approximately 500 Å.

As shown in FIG. 1, the third process layer 18 is formed above the second process layer 16. The third process layer 18 may be comprised of a variety of materials, such as silicon dioxide or a nitrogen bearing oxide, and may be formed by a variety of techniques known to those skilled in the art. The third process layer 18 is comprised of a thermally grown layer of silicon dioxide having a thickness ranging from approximately 150–250 Å, and in one embodiment is approximately 200 Å.

As shown in FIG. 1, the fourth process layer 20 is formed above the third process layer 18. The fourth process layer 20 may be comprised of a variety of materials, such as silicon nitride or other like material, and may be formed by a variety of techniques known to those skilled in the art. The fourth process layer 20 is comprised of a deposited layer of silicon nitride having a thickness ranging from approximately 1500–2000 Å, and in one embodiment is approximately 1750 Å.

Figure 2:
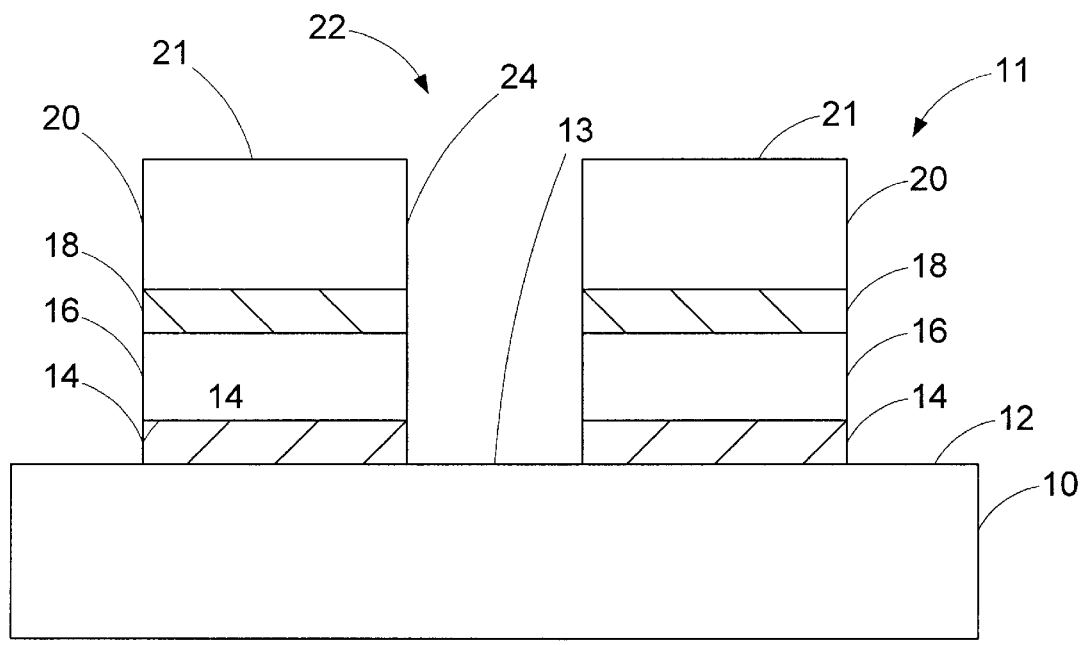
FIG. 2 is a cross-sectional view of the device depicted in FIG. 1 after an opening has been formed in the plurality of process layers.

As shown in FIG. 2, the process layers 14, 16, 18 and 20 are patterned to define an opening 22 having sidewalls 24. As is readily known to those skilled in the art, the opening 22 may be made by forming a layer of photoresist (not shown) above a surface 21 of the fourth process layer 20, developing the layer of photoresist, and performing one or more etching steps on the various process layers 14, 16, 18 and 20. Ultimately, this process will result in removal of all of the process layers 14, 16, 18 and 20 within the opening 22 to thereby expose a portion 13 of the surface 12 of the substrate 10. As is readily apparent to those skilled in the art, depending upon the materials of construction of the process layers 14, 16, 18 and 20, one or more etching steps may be useful in removing all of the aforementioned layers.

Figure 3:
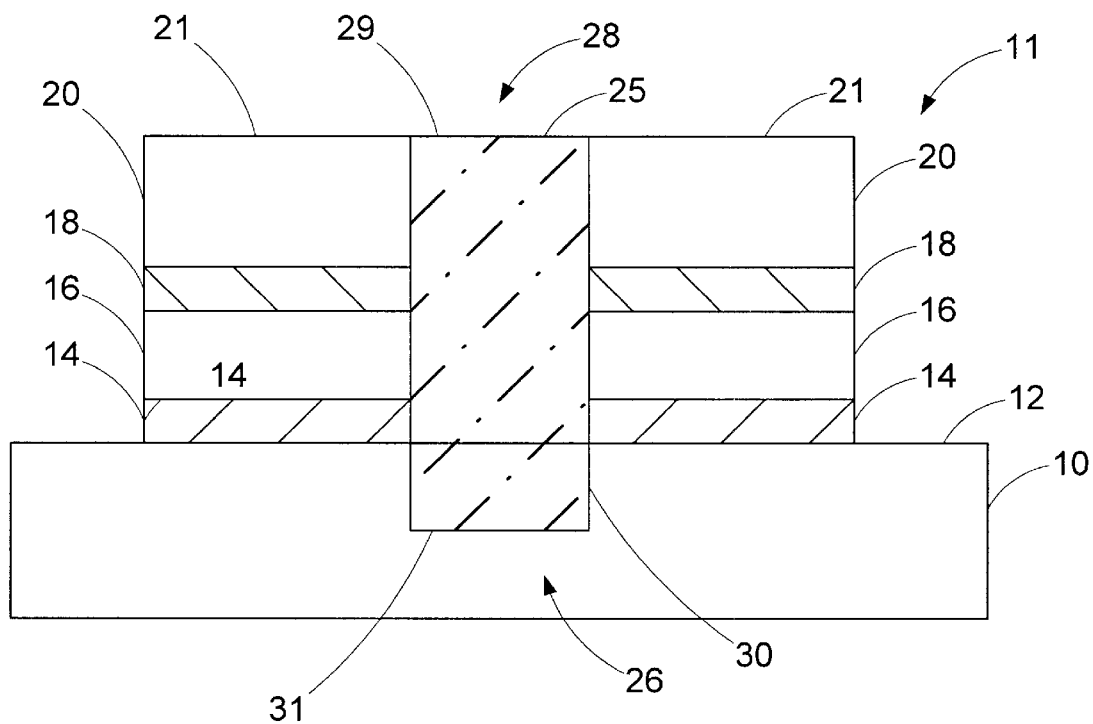
FIG. 3 is a cross-sectional view of the device depicted in FIG. 2 after the trench has been formed.

Thereafter, as shown in FIG. 3, a trench 26 defined by sidewalls 30 and a bottom surface 31 may then be formed in the substrate 10. The trench 26 may be formed by a variety of techniques, such as plasma etching or reactive ion etching using HBr and chlorine as the etchant gases. The width and depth of the trench 26 may be varied as a matter of design choice. For example, the trench 26 may be formed with a width that ranges from approximately 2000–3000 Å and a depth that ranges from approximately 200–7000 Å.

As shown in FIG. 3, a dielectric material 25 may then be positioned within the opening 22 and trench 26 to form an isolation 28. The isolation 28 may be formed of a variety of dielectric materials, such as TEOS, silicon dioxide, oxynitride, or other like material, and may be positioned within the opening 22 and trench 26 by a variety of known techniques. Of course, the isolation 28 may be a composite of such dielectric materials. Additionally, if desired, a thin liner may be formed on the sides 24 of the opening 22 and the sides 30 and the bottom surface 31 of the trench 26 by subjecting the device 11 to a heat treating process at a temperature ranging from approximately 850–1050° C.

After the isolation 28 is formed, the device 11 is subjected to a chemical mechanical processing step that planarizes the surface 29 of the isolation 28 as well as the surface 21 of the process layer 20. After the chemical mechanical polishing process is completed, the surface 29 of the isolation 28 should be slightly beneath the surface 21 of the fourth process layer 20.

Thereafter, the fourth process layer 20 may be removed by any of a variety of techniques, such as wet or dry etching, e.g., acid dip, plasma etching or reactive ion etching. In one illustrative embodiment, the fourth process layer 20 is comprised of silicon nitride that is removed by a wet etching process using phosphoric acid. Next, the third process layer 18 may be removed. As with the fourth process layer 20, the third process layer 18 may be removed by a variety of known techniques, for example, plasma etching, reactive ion etching, wet etching, etc. In one illustrative embodiment, where the third process layer 18 is comprised of silicon dioxide, the third process layer 18 may be removed by a relatively rapid plasma etch using $CHF_3$ and $CF_4$ as the etchant gases.

During the course of removing this third process layer 18 comprised of silicon dioxide, the height of the isolation 28 will be reduced by approximately the same amount as the thickness of the third process layer 18. However, using the present technique, the isolation 28 has a much greater exposed height than current isolations used in semiconductor fabrication. This additional height is useful in that, even though some portion of the height of the isolation will be reduced in subsequent processing steps, e.g., multiple cleanings of native oxide from various silicon surfaces, the resultant isolation 28 will be of sufficient height to work for its intended purpose.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an isolation, the method comprising:

forming a first process layer above a surface of a semiconducting substrate;

forming a second process layer above said first process layer;

forming a third process layer above said second process layer;

forming a fourth process layer as a planarization stop layer above said third process layer, said planarization stop layer having an upper surfaces forming the first, second, third and fourth process layers to have a combined thickness extending above the surface of the substrate of at least about 2150 Å;

patterning said first, second, third and fourth process layers to define an opening and expose a portion of said surface of said substrate;

etching a trench in said substrate;

forming at least one dielectric material in said opening and said trench, said at least one dielectric material having an upper surface; and planarizing said upper surface of said at least one dielectric material and said upper surface of said planarization stop layer by chemical mechanical polishing.

2. The method of claim 1, wherein forming the fourth process layer as the planarization stop layer above said third process layer comprises forming the fourth process layer to include silicon nitride.

3. The method of claim 1, wherein:
forming said first and third process layers comprises forming the first and third process layers to include silicon dioxide; and
forming said second and fourth process layers comprises forming the second and fourth process layers to include silicon nitride.

4. The method of claim 1, wherein:
forming said first and third process layers comprises thermally growing the first and third process layers, the first and third process layers including silicon dioxide; and
forming said second and fourth process layers comprises depositing the second and fourth process layers, the second and fourth process layers including silicon nitride.

5. The method of claim 1, wherein:
forming said first and third process layers comprises depositing the first and third process layers, the first and third process layers including silicon dioxide; and
forming said second and fourth process layers comprises depositing the second and fourth process layers, the second and fourth process layers including silicon nitride.

6. The method of claim 1, further comprising removing at least a portion of said third and fourth process layers adjacent said at least one dielectric material in said opening and said trench.

7. The method of claim 1, wherein forming said first, second, third and fourth process layers comprises forming said first, second, third and fourth process layers to have a combined thickness extending above said surface of said substrate that ranges from approximately 2150–3050 Å.

8. A method of forming an isolation, the method comprising:
forming a first layer of silicon dioxide above a surface of a semiconducting substrate;
forming a first layer of silicon nitride above said first layer of silicon dioxide;
forming a second layer of silicon dioxide above said first layer of silicon nitride;
forming a second layer of silicon nitride as a planarization stop layer above said second layer of silicon dioxide, said planarization stop layer having an upper surface, forming the first and second layers of silicon dioxide, and the first and second layers of silicon nitride to have a combined thickness extending above the surface of the substrate of at least about 2150 Å;
patterning said first and second layers of silicon dioxide and said first and second layers of silicon nitride to define an opening and expose a portion of said surface of said substrate;
etching a trench in said substrate;
forming at least one dielectric material in said opening and said trench, said at least one dielectric material having an upper surface; and
planarizing said upper surface of said at least one dielectric material and said upper surface of said planarization stop layer by chemical mechanical polishing.

9. The method of claim 8, wherein forming the first layer of silicon dioxide above the surface of the semiconducting substrate comprises forming the first layer of silicon dioxide to have a thickness ranging from approximately 100–200 Å.

10. The method of claim 8, wherein forming the first layer of silicon nitride above said first layer of silicon dioxide comprises forming the first layer of silicon nitride to have a thickness ranging from approximately 400–600 Å.

11. The method of claim 8, wherein forming the second layer of silicon dioxide above said first layer of silicon nitride comprises forming the second layer of silicon dioxide to have a thickness ranging from approximately 150–250 Å.

12. The method of claim 8, wherein forming the second layer of silicon nitride as the planarization stop layer above said second layer of silicon dioxide comprises forming the second layer of silicon nitride to have a thickness ranging from approximately 1500–2000 Å.

13. The method of claim 9, wherein said first layer of silicon dioxide is thermally grown.

14. The method of claim 10, wherein said first layer of silicon nitride is deposited.

15. The method of claim 11, wherein said second layer of silicon dioxide is thermally grown.

16. The method of claim 12, wherein said second layer of silicon nitride is deposited.

17. A method of forming an isolation, the method comprising:
thermally growing a first layer of silicon dioxide above a surface of a semiconducting substrate;
depositing a first layer of silicon nitride above said first layer of silicon dioxide;
thermally growing a second layer of silicon dioxide above said first layer of silicon nitride;
depositing a second layer of silicon nitride as a planarization stop layer above said second layer of silicon dioxide, said planarization stop layer having an upper surface, forming the first and second layers of silicon dioxide, and the first and second layers of silicon nitride to have a combined thickness extending above the surface of the substrate of at least about 2150 Å;
patterning said first and second layers of silicon dioxide and said first and second layers of silicon nitride to define an opening and expose a portion of said surface of said substrate;
etching a trench in said substrate;
forming at least one dielectric material in said opening and said trench, said at least one dielectric material having an upper surface; and
planarizing said upper surface of said at least one dielectric material and said upper surface of said planarization stop layer by chemical mechanical polishing.

18. The method of claim 17, wherein thermally growing the first layer of silicon dioxide above the surface of the semiconducting substrate comprises thermally growing the first layer of silicon dioxide to have a thickness ranging from approximately 100–200 Å.

19. The method of claim 17, wherein depositing the first layer of silicon nitride above said first layer of silicon dioxide comprises depositing the first layer of silicon nitride to have a thickness ranging from approximately 400–600 Å.

20. The method of claim 17, wherein thermally growing the second layer of silicon dioxide above said first layer of silicon nitride comprises thermally growing the second layer of silicon dioxide to have a thickness ranging from approximately 150–250 Å.

21. The method of claim 17, wherein depositing the second layer of silicon nitride as the planarization stop layer above said second layer of silicon dioxide comprises depositing the second layer of silicon nitride to have a thickness ranging from approximately 1500–2000 Å.

* * * * *